United States Patent
Cheng

(10) Patent No.: US 9,013,922 B2
(45) Date of Patent: Apr. 21, 2015

(54) DATA STORAGE DEVICE AND FLASH MEMORY CONTROL METHOD THEREOF

(71) Applicant: Silicon Motion, Inc., Jhubei, Hsinchu County (TW)

(72) Inventor: Chang-Kai Cheng, Hsinchu (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 41 days.

(21) Appl. No.: 13/966,554

(22) Filed: Aug. 14, 2013

(65) Prior Publication Data

US 2014/0078825 A1 Mar. 20, 2014

Related U.S. Application Data

(60) Provisional application No. 61/703,447, filed on Sep. 20, 2012.

(51) Int. Cl.
*G11C 16/16* (2006.01)
*G06F 12/06* (2006.01)

(52) U.S. Cl.
CPC .............. *G11C 16/16* (2013.01); *G06F 12/06* (2013.01)

(58) Field of Classification Search
CPC ........................................ G11C 16/16
USPC ..................................... 365/185.11
See application file for complete search history.

(56) References Cited

U.S. PATENT DOCUMENTS

| | | | |
|---|---|---|---|
| 2007/0081401 A1* | 4/2007 | Chen | 365/200 |
| 2010/0228928 A1* | 9/2010 | Asnaashari et al. | 711/154 |
| 2012/0297117 A1* | 11/2012 | Jo et al. | 711/103 |
| 2013/0054878 A1* | 2/2013 | Lee et al. | 711/103 |

* cited by examiner

*Primary Examiner* — Hoai V Ho
*Assistant Examiner* — Tri Hoang
(74) *Attorney, Agent, or Firm* — McClure, Qualey & Rodack, LLP

(57) ABSTRACT

Storage space allocation and a wear leveling technique for a FLASH memory module are disclosed. The FLASH memory module includes a plurality of FLASH chips. A controller for the FLASH memory module divides the storage space of the FLASH memory module into Xblocks for management of the FLASH memory module. The controller erases at least one Xblock for space release and moves data on Xblocks for wear leveling.

14 Claims, 5 Drawing Sheets

DATA STORAGE DEVICE AND FLASH MEMORY CONTROL METHOD THEREOF

CROSS REFERENCE TO RELATED APPLICATIONS

This application claims the benefit of U.S. Provisional Application No. 61/703,447 filed Sep. 20, 2012 is incorporated by reference herein.

BACKGROUND OF THE INVENTION

1. Field of the Invention

The present invention relates to data storage devices, and in particular, relates to FLASH memory control methods.

2. Description of the Related Art

A Flash memory is a general non-volatile storage device that is electrically erased and programmed A NAND Flash, for example, is primarily used in memory cards, USB flash devices, solid-state drives, eMMCs (embedded MultiMediaCards), and so on.

In a FLASH memory, the damaged space should be isolated from the normal operations of the FLASH memory. When most space of a FLASH memory is damaged, the operation efficiency of the FLASH memory may be poor and thereby the lifespan of the FLASH memory may expire more quickly.

It is an important issue to prolong the lifespan of a FLASH memory.

BRIEF SUMMARY OF THE INVENTION

A data storage device and a FLASH memory control method are disclosed. Especially, in the disclosure, multiple FLASH chips (e.g., numbered from CE0 to CEN) are packaged or coupled together to form a FLASH memory module. Note that the different FLASH chips may be accessed at a same time. The requirement to read/write data from/into the different FLASH chips in a time-slice manner can be eliminated.

A data storage device in accordance with an exemplary embodiment of the invention comprises a FLASH memory module and a controller. The FLASH memory module comprises a plurality of FLASH chips. The controller divides the storage space of the FLASH memory module into Xblocks for management of the FLASH memory module. The controller erases at least one Xblock for space release and moves data on Xblocks for wear leveling.

A FLASH memory control method in accordance with an exemplary embodiment of the invention comprises the following steps: providing a FLASH memory module comprising a plurality of FLASH chips; dividing the storage space of the FLASH memory module into Xblocks for management of the FLASH memory module; erasing at least one Xblock for space release; and moving data between Xblocks for wear leveling.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
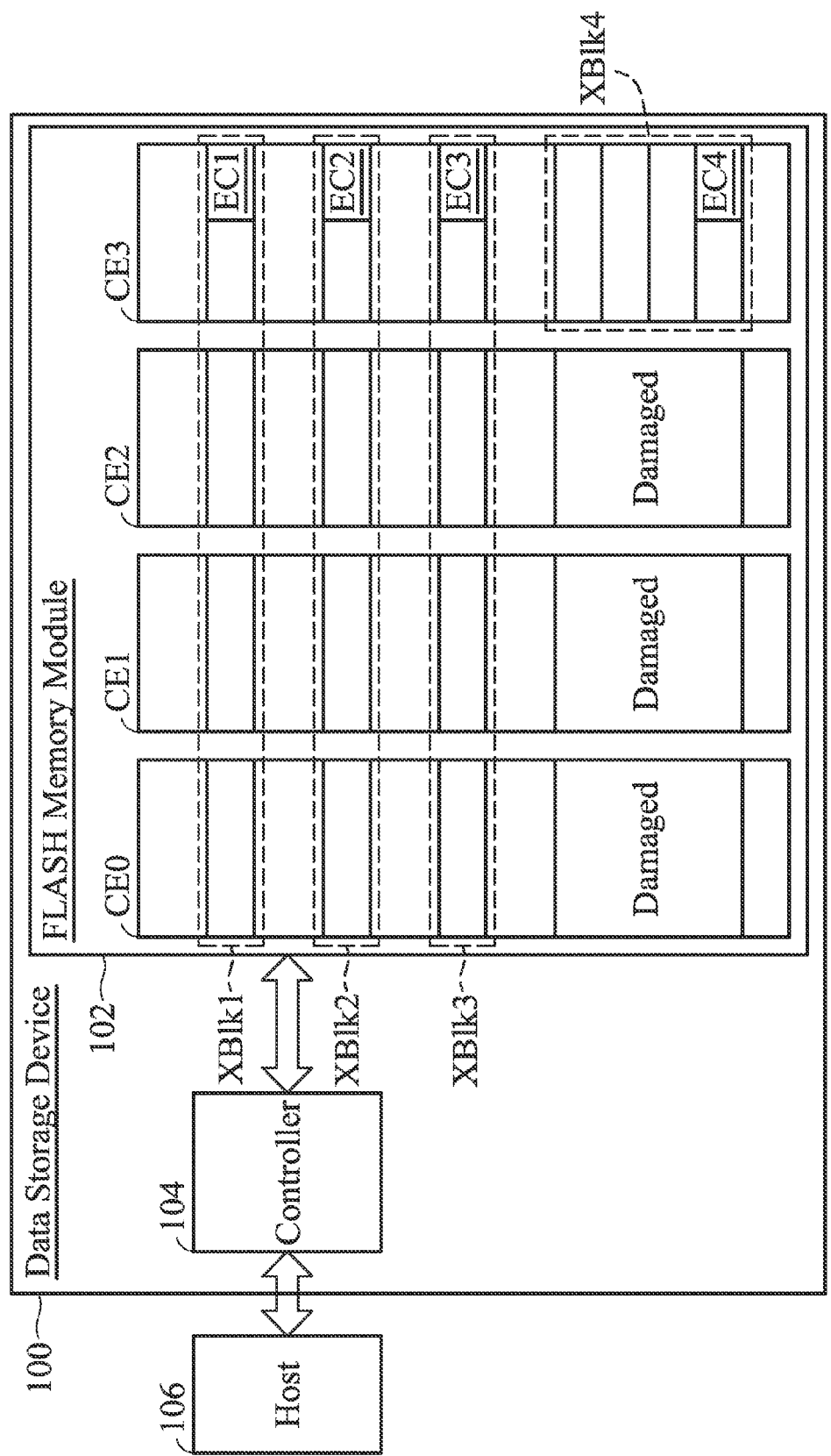
FIG. 1 is a block diagram depicting a data storage device 100 in accordance with an exemplary embodiment of the invention.

FIG. 1 is a block diagram depicting a data storage device 100 in accordance with an exemplary embodiment of the invention. The data storage device 100 comprises a FLASH memory module 102 and a controller 104. The controller 104 may be coupled to a host 106. The host 106 may issue commands to the controller 104 and thereby operate the FLASH memory module 102.

The FLASH memory module 102 comprises multiple FLASH chips CE0 . . . CE3. Note that the different FLASH chips CE0 . . . CE3 may be accessed at a same time. The requirement to read/write data from/into the different FLASH chips CE0 . . . CE3 in a time-slice manner can be eliminated.

The controller 104 divides the storage space of the FLASH memory module 102 into Xblocks XB1k1, XB1k2, XB1k3, and XB1k4 and so on, for management of the FLASH memory module 102. Note that in at least parts of the Xblocks, e.g. XB1k1~XB1k3, each Xblock provides a storage space, wherein the storage space is scattered over the different FLASH chips CE0 to CE3. The technique for obtaining the Xblocks XB1k1~XB1k3 (each provides a storage space, wherein the storage space is scattered over at least two different FLASH chips) may be called a cross-chip space division technique. In a case wherein the different FLASH chips CE0~CE3 are not equally damaged, the non-divided space of a best-conditioned FLASH chip (e.g., CE3) after the cross-chip block division may be further divided into Xblocks by the controller 104 for increased storage density. For example, the Xblock XB1k4 is completely provided by the single FLASH chip CE3.

The space of the FLASH memory module 102 has to be released Xblock by Xblock. An erase operation that the controller 104 performs for space release is operated on the entire Xblock.

The controller 104 may further moves data from a source Xblock to a destined Xblock for wear leveling. In an exemplary embodiment, the controller 104 moves hot data to rarely used Xblocks of the Xblocks of the FLASH memory module 102 for wear leveling over the different FLASH chips CE0 to CE3. Because of the cross-chip block division technique, no FLASH chip is more heavily used than the other FLASH chips. Thus, the lifespan of the FLASH memory module 102 is considerably extended.

The controller 104 may record an erase count for each Xblock. The controller 104 may determine whether an Xblock is a source Xblock or a destined Xblock based on the erase count thereof Every time an erase operation is performed on an Xblock, the erase count corresponding thereto is increased by 1. The controller 104 may determine whether an Xblock is a rarely used space based on the erase count thereof In an exemplary embodiment, the controller 104 may utilize an information space of each Xblock to store the erase count corresponding thereto. As shown, an erase count EC1 is recorded for the Xblock XB1k1, an erase count EC2 is recorded for the Xblock XB1k2, an erase count EC3 is recorded for the Xblock XB1k3, and an erase count EC4 is recorded for the Xblock XB1k4. A wear leveling procedure performed on the different Xblocks may be based on the erase counts of the different Xblocks.

Figure 2:
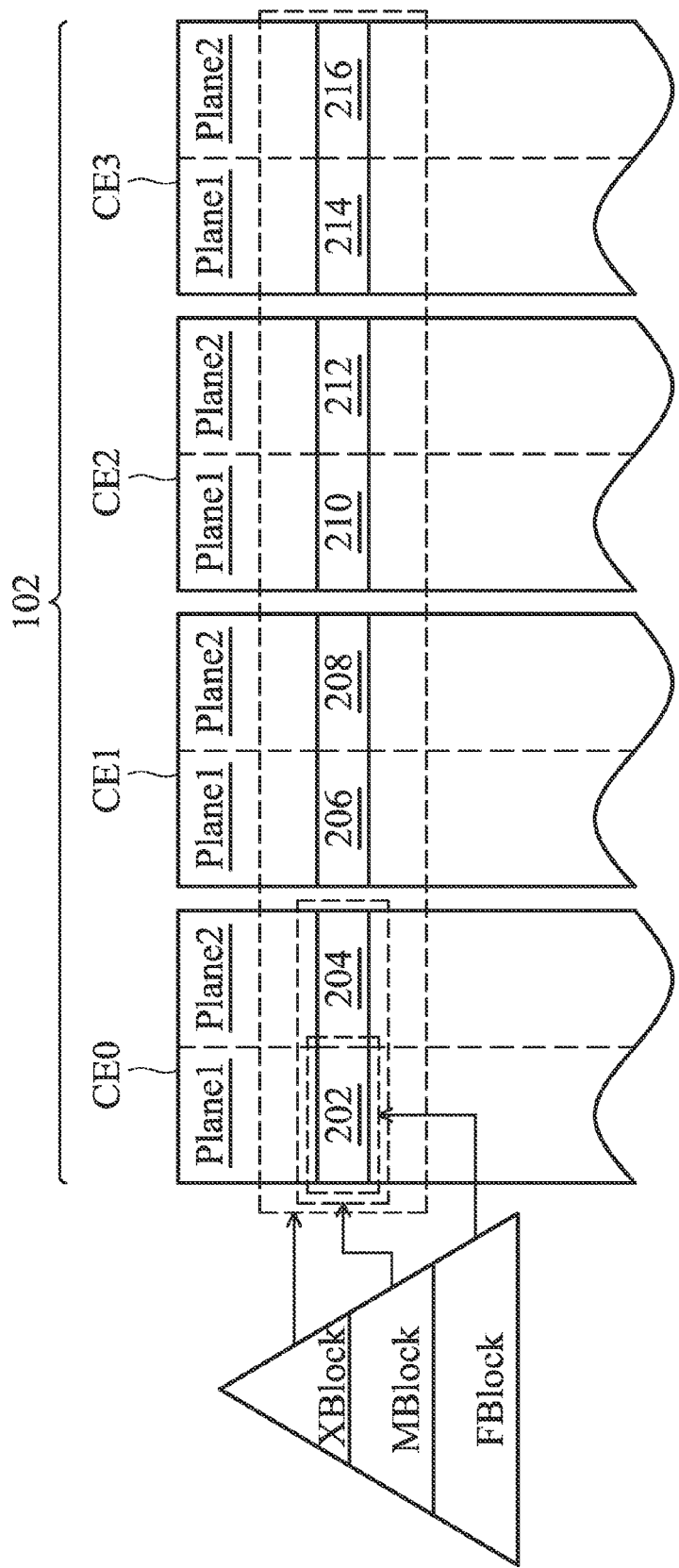
FIG. 2 shows three hierarchies for storage space division.

The storage space of the FLASH memory module 102 may be divided in a hierarchical manner. FIG. 2 shows three hierarchies for storage space division. As shown, there are four FLASH chips CE0 to CE3 within the FLASH memory module 102. Each FLASH chip comprises pages provided in two different planes Plane1 and Plane2. The controller 104 takes each page as an FBlock. For example, page 202 is regarded as an FBlock, and page 204 is regarded as another FBlock. The controller 104 takes two FBlocks from different planes of a single FLASH chip as an MBlock. For example, FBlock 202 in the first plane Plane1 of the FLASH chip CE0 and FBlock 204 in the second plane Plane2 of the FLASH chip CE0 are combined as an MBlock. Further, FBlock 206 and FBlock 208 are combined as an MBlock in the FLASH chip CE1, FBlock 210 and FBlock 212 are combined as an MBlock in the FLASH chip CE2, and FBlock 214 and FBlock 216 are combined as an MBlock in the FLASH chip CE3. Further, according to the disclosure, the four MBlocks from the different FLASH chips CE0~CE3 may be combined together to form an Xblock (e.g. XB1k1, or XB1k2 or XB1k3 of FIG. 1).

Note that FIG. 2 is not intended to limit the hierarchy architecture. The total number of the FLASH chips within a FLASH memory module may be N1, a number depending on the design of the FLASH memory module. Each FLASH chip comprises pages provided in N2 different planes, where N2 is a number depending on the design of each FLASH chip. N3 page(s) of a single plane may be regarded as an FBlock, where N3 is a number depending on user settings. N2 FBlocks from the N2 different planes of a single FLASH chip may be regarded as an MBlock. Each Xblock of the disclosure comprises N1 MBlocks. Each Xblock may comprise N1 MBlocks scattered over at least two different FLASH chips. When the different FLASH chips are extremely unequally damaged, there are some Xblocks provided by just the best-conditioned FLASH chip, wherein the N1 MBlocks of an Xblock are located in the same FLASH chip.

Figure 3:
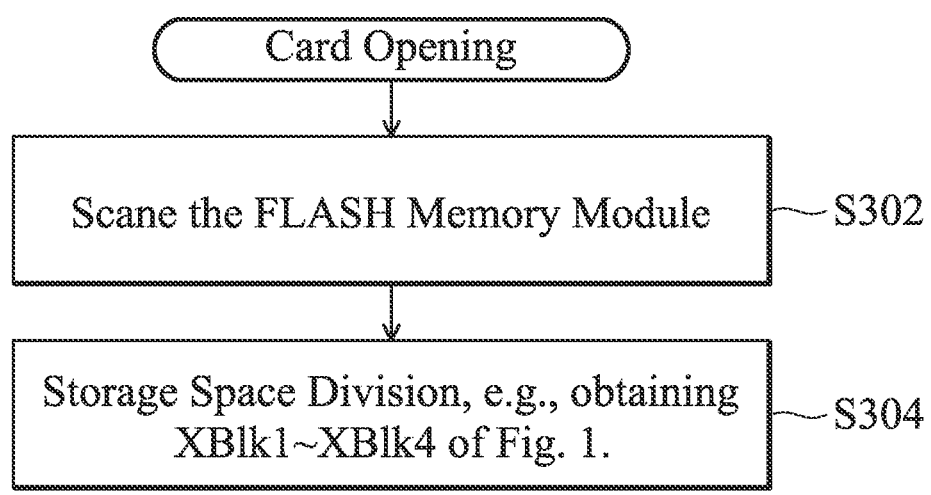
FIG. 3 is a flowchart depicting the space division procedure in accordance with an exemplary embodiment of the disclosure.

FIG. 3 is a flowchart depicting the space division procedure in accordance with an exemplary embodiment of the disclosure, which is arranged in a card opening process of the FLASH memory module 102. According to a card opening command, step S302 may be performed before formatting the FLASH memory module 102. In step S302, the controller 104 scans the FLASH memory module 102 to find out the damaged space of the FLASH memory module 102. In step S304, the controller 104 divides the storage space of the FLASH memory module 102 into the disclosed Xblocks based on the scanned result, wherein the damaged space of the FLASH memory module 102 is excluded from being used. As shown in FIG. 1, Xblocks XB1k1~XB1k4 and so on are obtained. In some exemplary embodiments, a mapping table is established in step S304, showing how the MBlocks in the FLASH chips are divided into the Xblocks.

Figure 4:
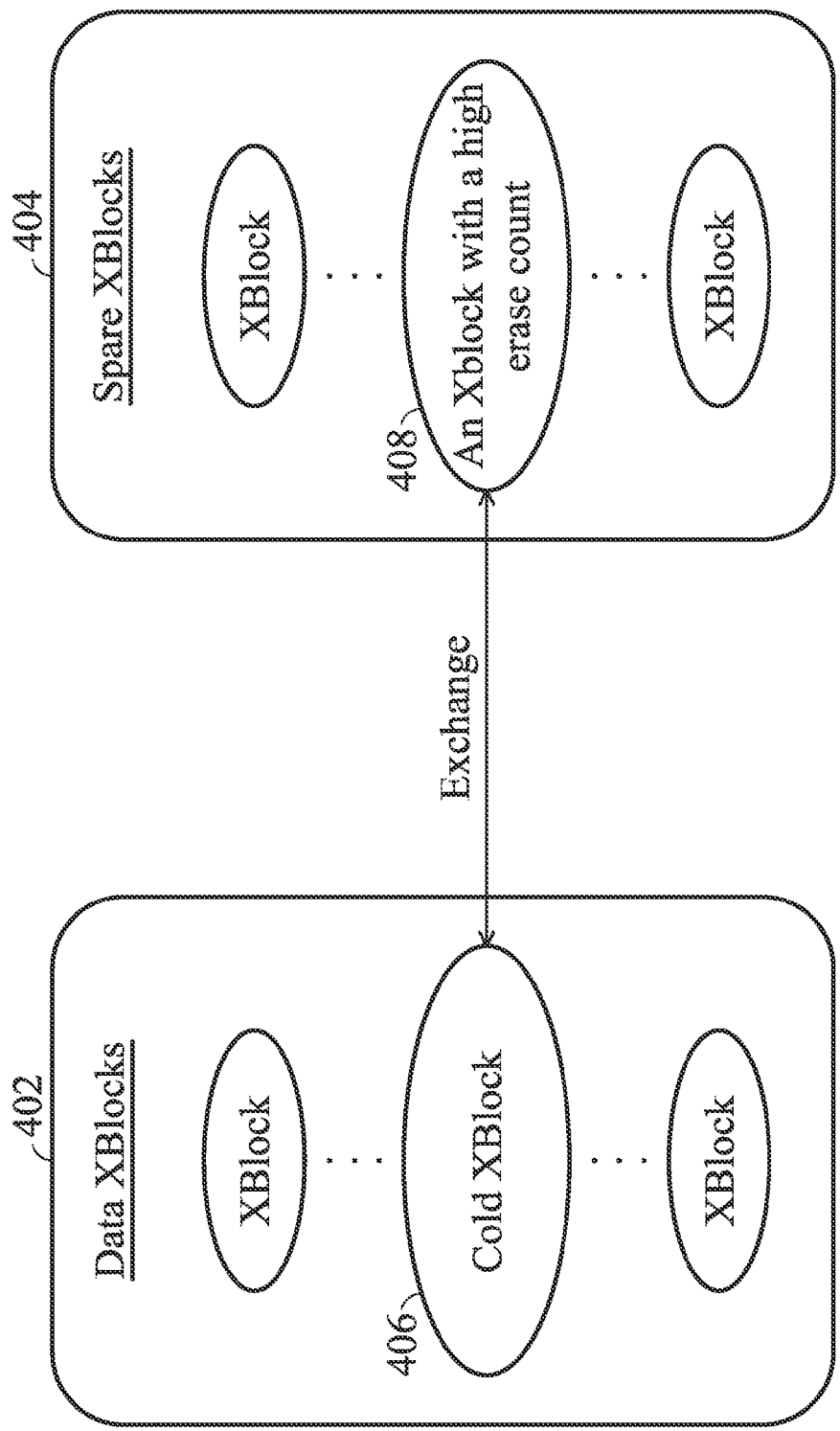
FIG. 4 depicts a wear leveling technique for the FLASH memory module 102 in accordance with an exemplary embodiment of the invention.

FIG. 4 depicts a wear leveling technique for the FLASH memory module 102 in accordance with an exemplary embodiment of the invention. Note that the FLASH memory module 102 is divided into the disclosed Xblocks. The data Xblocks 402 are stored with data. The spare Xblocks 404 are free and await allocation. By the wear leveling technique, the rarely-changed data is moved from the cold Xblock 406 to the Xblock 408 having a high erase count. Thus, the Xblock 408 on the verge of damage is frozen by cold data, and, the Xblock 406 which was rarely used before is released for hot data storage.

Figure 5:
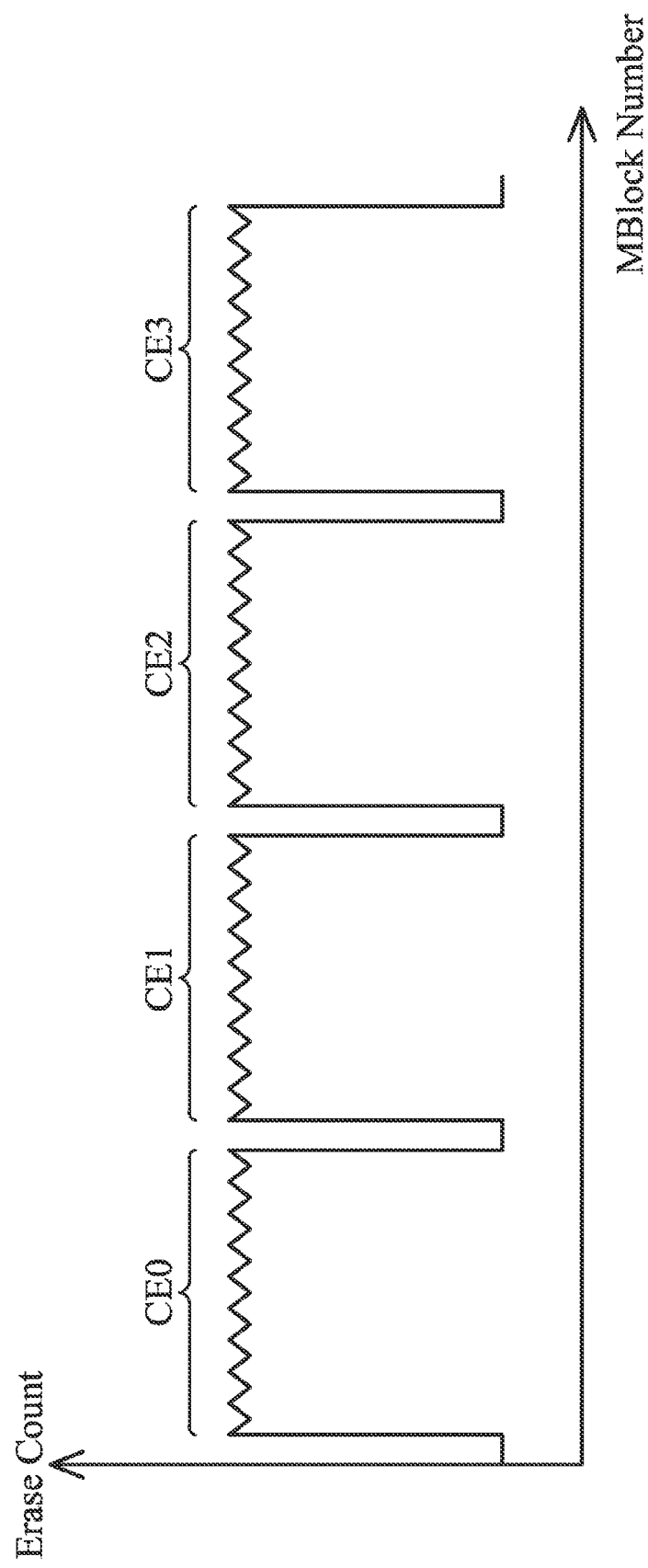
FIG. 5 is a statistical chart showing the erase counts of the different MBlocks of the different FLASH chips CE0 to CE3.

FIG. 5 is a statistical chart showing the erase counts of the different MBlocks of the different FLASH chips CE0 to CE3. As shown, the MBlocks of the different FLASH chips CE0 to CE3 are equally utilized by the disclosed technique. No physical space is excessively used. Thus, the lifespan of the FLASH memory module 102 is considerably extended.

In some exemplary embodiments, the controller 104 may include a computing unit and a read-only memory (ROM) stored with a ROM code. The ROM code may be coded according to the disclosure to be executed by the computing unit. The disclosed storage space division and wear leveling techniques, therefore, may be implemented by firmware. Further, any control method for a FLASH memory involving the disclosed storage space division and wear leveling techniques is also in the scope of the invention.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a FLASH memory module, comprising a plurality of FLASH chips; and
a controller, dividing the storage space of the FLASH memory module into Xblocks for management of the FLASH memory module,
wherein:
the controller erases at least one Xblock for space release;
the controller moves data on Xblocks for wear leveling;
the controller scans the FLASH memory module in a card opening process of the FLASH memory module, to find out damaged space of the FLASH memory module;
the controller divides the storage space of the FLASH memory module into the Xblocks based on the scanned result, to exclude the damaged space of the FLASH memory module from utilization;
when the scanned result shows that the different FLASH chips are not equally damaged, the non-divided space in a best-conditioned FLASH chip after a cross-chip block division is divided into Xblocks by the controller; and
each Xblock obtained from the cross-chip block division provides a storage space, wherein the storage space is scattered over at least two different FLASH chips.

2. The data storage device as claimed in claim 1, wherein at least parts of the Xblocks are scattered over different FLASH chips.

3. The data storage device as claimed in claim 1, wherein the controller moves data from a source Xblock to a destined Xblock for wear leveling.

4. The data storage device as claimed in claim 3, wherein:
the controller further records an erase count for each Xblock; and
the controller determines whether an Xblock is the source Xblock or the destined Xblock based on the erase count thereof.

5. The data storage device as claimed in claim 4, wherein:
the controller utilizes an information space of each Xblock to store the erase count corresponding thereto.

6. The data storage device as claimed in claim 1, wherein:
the total number of the FLASH chips within the FLASH memory module is 4;
each FLASH chip comprises pages of a first plane and pages of a second plane;
the controller takes each page as an FBlock;
the controller takes two FBlocks from different planes of a single FLASH chip as an MBlock; and
each of the Xblocks obtained by the controller comprises 4 MBlocks.

7. The data storage device as claimed in claim 1, wherein:
the total number of the FLASH chips within the FLASH memory module is N1;
each FLASH chip comprises pages provided in N2 different planes, where N2 is a number;
the controller takes N3 page(s) of a single plane as an FBlock, where N3 is a number;
the controller takes N2 FBlocks from the N2 different planes of a single FLASH chip as an MBlock; and
each of the Xblocks obtained by the controller comprises N1 MBlocks.

8. A FLASH memory control method, comprising:
providing a FLASH memory module comprising a plurality of FLASH chips;
dividing the storage space of the FLASH memory module into Xblocks for management of the FLASH memory module;
erasing at least one Xblock for space release;
moving data between Xblocks for wear leveling;
scanning the FLASH memory module in a card opening process of the FLASH memory module, to find out damaged space of the FLASH memory module;
dividing the storage space of the FLASH memory module into the Xblocks based on the scanned result, to exclude the damaged space of the FLASH memory module from utilization;
when the scanned result shows that the different FLASH chips are not equally damaged, diving the non-divided space of a best-conditioned FLASH chip after a cross-chip block division into Xblocks,
wherein each Xblock obtained from the cross-chip block division provides a storage space, wherein the storage space is scattered over at least two different FLASH chips.

9. The FLASH memory control method as claimed in claim 8, wherein at least parts of the Xblocks are scattered over different FLASH chips.

10. The FLASH memory control method as claimed in claim 8, wherein the moving data between Xblocks is moving data from a source Xblock to a destined Xblock for wear leveling.

11. The FLASH memory control method as claimed in claim 10, further comprising:
recording an erase count for each Xblock; and
determining whether an Xblock is the source Xblock or the destined Xblock based on the erase count thereof.

12. The FLASH memory control method as claimed in claim 11, further comprising:
utilizing an information space of each Xblock to store the erase count corresponding thereto.

13. The FLASH memory control method as claimed in claim 8, wherein:
the total number of the FLASH chips within the FLASH memory module is 4;
each FLASH chip comprises pages of a first plane and pages of a second plane;
each page is regarded as an FBlock;
two FBlocks from different planes of a single FLASH chip is regarded as an MBlock; and
each of the Xblocks comprises 4 MBlocks.

14. The FLASH memory control method as claimed in claim 8, wherein:
the total number of the FLASH chips within the FLASH memory module is N1;
each FLASH chip comprises pages provided in N2 different planes, where N2 is a number;
N3 page(s) of a single plane is/are regarded as an FBlock, where N3 is a number;
N2 FBlocks from the N2 different planes of a single FLASH chip is regarded as an MBlock; and
each of the Xblocks comprises N1 MBlocks.

* * * * *